US012562730B2

(12) United States Patent
Sung et al.

(10) Patent No.: US 12,562,730 B2
(45) Date of Patent: Feb. 24, 2026

(54) SWITCH DEVICE AND OPERATION METHOD THEREOF

(71) Applicant: Wistron Corp., New Taipei (TW)

(72) Inventors: Yung Chi Sung, New Taipei (TW);
Chun Hao Huang, New Taipei (TW);
Shen Chia Wu, New Taipei (TW);
Huan Jung Ho, New Taipei (TW)

(73) Assignee: WISTRON CORP, New Taipei (TW)

( * ) Notice: Subject to any disclaimer, the term of this patent is extended or adjusted under 35 U.S.C. 154(b) by 0 days.

(21) Appl. No.: 18/736,750

(22) Filed: Jun. 7, 2024

(65) Prior Publication Data

US 2025/0286551 A1     Sep. 11, 2025

(30) Foreign Application Priority Data

Mar. 7, 2024     (TW) ................................. 113108248

(51) Int. Cl.
H03K 17/56          (2006.01)
H03K 19/20          (2006.01)
(52) U.S. Cl.
CPC ............. H03K 17/56 (2013.01); H03K 19/20 (2013.01)
(58) Field of Classification Search
CPC ................................ H03K 17/56; H03K 19/20
See application file for complete search history.

(56) References Cited

U.S. PATENT DOCUMENTS

| | | | | |
|---|---|---|---|---|
| 2007/0214371 A1* | 9/2007 | You | ........................ | G06F 1/3231 |
| | | | | 713/300 |
| 2016/0147690 A1* | 5/2016 | He | ........................ | G06F 13/4022 |
| | | | | 710/316 |
| 2023/0280803 A1* | 9/2023 | Hsu | ........................ | G06F 13/423 |
| | | | | 361/679.32 |
| 2023/0386554 A1* | 11/2023 | Fan | ........................ | H03K 17/693 |

FOREIGN PATENT DOCUMENTS

| | | | | |
|---|---|---|---|---|
| CN | 106100329 A | * | 11/2016 | ............ H02M 3/157 |
| CN | 111338453 A | * | 6/2020 | .............. G06F 1/26 |
| TW | 201800955 A | * | 1/2018 | |
| TW | 202336552 A | | 9/2023 | |

OTHER PUBLICATIONS

Translation of TW-201800955-A (Year: 2018).*
Translation of CN-106100329-A (Year: 2016).*
Translation of CN-111338453-A (Year: 2020).*
Chinese language office action dated Nov. 7, 2024, issued in application No. TW 113108248.

* cited by examiner

*Primary Examiner* — Henry Tsai
*Assistant Examiner* — John B Roche
(74) *Attorney, Agent, or Firm* — McClure, Qualey & Rodack, LLP

(57)          ABSTRACT

A switch device and an operation method thereof are provided. The switch device is disposed on a motherboard, and the motherboard is suitable for connecting to a graphics card. The switch device includes a control module and a switch module. The control module receives a first signal and a second signal and generates a first control signal and a second control signal according to the first signal and the second signal. The switch module is connected to a first pin, a second pin, a third pin, and the control module. The switch device receives the first control signal and the second control signal, and switches a connection among the first pin, the second pin, and the third pin according to the first control signal and the second control signal. The first pin and the second pin are suitable for connecting to the graphics card.

20 Claims, 7 Drawing Sheets

<u>110</u>

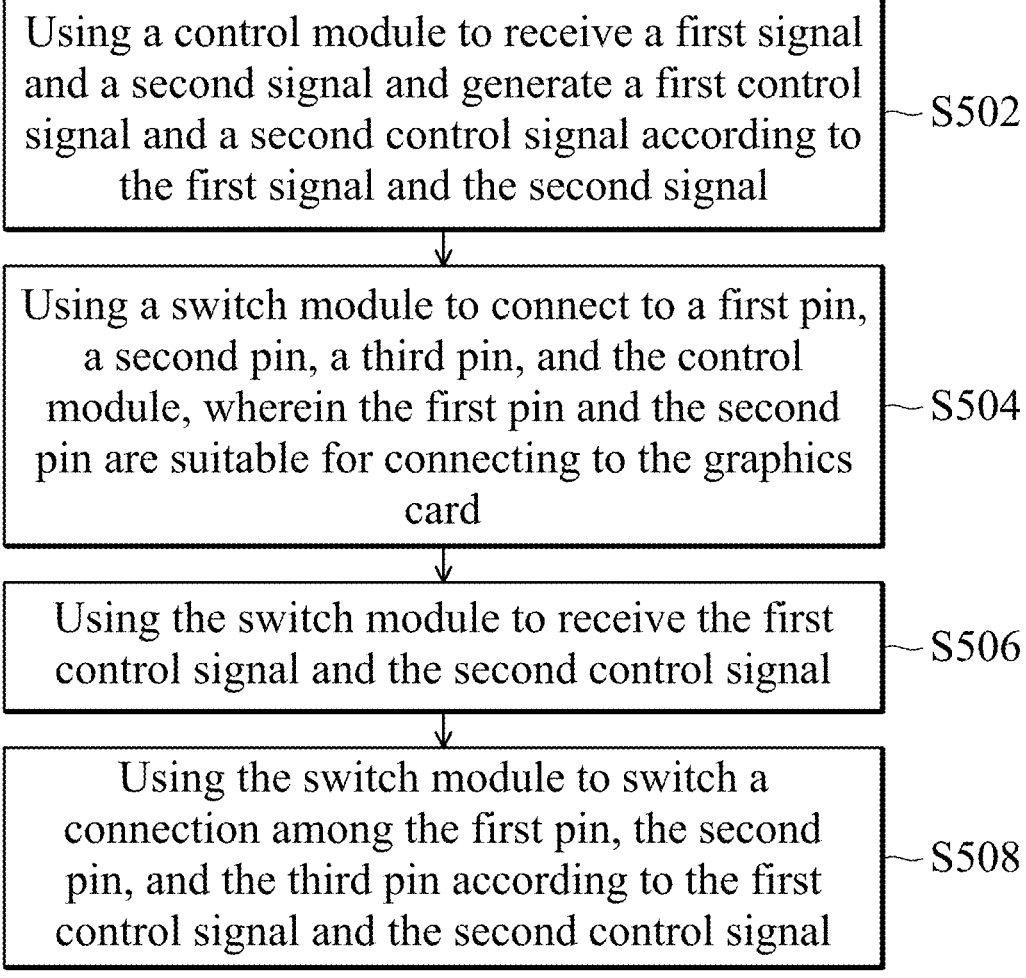

Using a control module to receive a first signal and a second signal and generate a first control signal and a second control signal according to the first signal and the second signal ~S502

Using a switch module to connect to a first pin, a second pin, a third pin, and the control module, wherein the first pin and the second pin are suitable for connecting to the graphics card ~S504

Using the switch module to receive the first control signal and the second control signal ~S506

Using the switch module to switch a connection among the first pin, the second pin, and the third pin according to the first control signal and the second control signal ~S508

FIG. 5

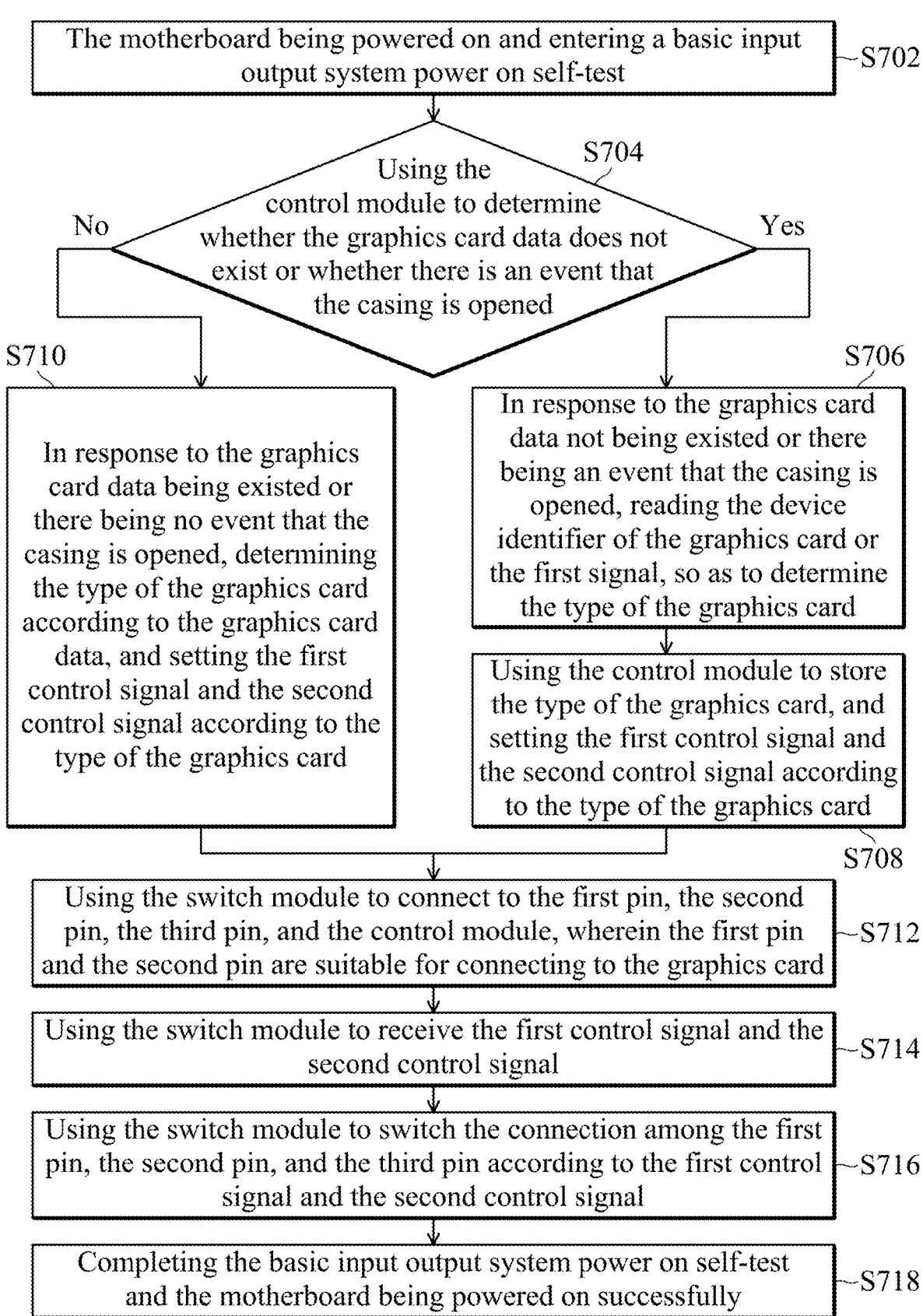

The motherboard being powered on and entering a basic input output system power on self-test ~S702

Using the control module to determine whether the graphics card data does not exist or whether there is an event that the casing is opened    S704

No    Yes

S710

In response to the graphics card data being existed or there being no event that the casing is opened, determining the type of the graphics card according to the graphics card data, and setting the first control signal and the second control signal according to the type of the graphics card

S706

In response to the graphics card data not being existed or there being an event that the casing is opened, reading the device identifier of the graphics card or the first signal, so as to determine the type of the graphics card Using the control module to store the type of the graphics card, and setting the first control signal and the second control signal according to the type of the graphics card

S708

Using the switch module to connect to the first pin, the second pin, the third pin, and the control module, wherein the first pin and the second pin are suitable for connecting to the graphics card ~S712

Using the switch module to receive the first control signal and the second control signal ~S714

Using the switch module to switch the connection among the first pin, the second pin, and the third pin according to the first control signal and the second control signal ~S716

Completing the basic input output system power on self-test and the motherboard being powered on successfully ~S718

FIG. 7

SWITCH DEVICE AND OPERATION METHOD THEREOF

CROSS REFERENCE TO RELATED APPLICATIONS

This application claims priority of Taiwan Patent Application No. 113108248, filed on Mar. 7, 2024, the entirety of which is incorporated by reference herein.

BACKGROUND OF THE INVENTION

Field of the Invention

An embodiment of the present invention relates to a switch device, and in particular it relates to a switch device and operation method thereof.

Description of the Related Art

Generally, different types of graphics cards may have different designs. For example, a particular function may be assigned to different pins in different types of graphics cards. Since the function defined by a pin of a graphics card can be changed, however, different types of graphics cards may not be used on the same motherboard, causing inconvenience in use. Therefore, how to allow different types of graphics cards to operate normally on the same motherboard has become one of the important problems to be solved.

BRIEF SUMMARY OF THE INVENTION

An embodiment of the present invention provides a switch device and an operation method thereof, so that different types of display cards may be operated normally on the same motherboard, thereby reducing the complexity of the design and increasing the convenience of use.

An embodiment of the present invention provides a switch device, which is disposed on a motherboard, and the motherboard is suitable for connecting to a graphics card. The switch device includes a control module and a switch module. The control module is configured to receive a first signal and a second signal and generate a first control signal and a second control signal according to the first signal and the second signal. The switch module is connected to a first pin, a second pin, a third pin, and the control module. The switch module is configured to receive the first control signal and the second control signal, and switch a connection among the first pin, the second pin, and the third pin according to the first control signal and the second control signal. The first pin and the second pin are suitable for connecting to the graphics card.

In addition, an embodiment of the present invention provides an operation method of a switch device. The switch device is disposed on a motherboard, and the motherboard is suitable for connecting to a graphics card. The operation method of the switch device includes the following steps. A control module is used to receive a first signal and a second signal and generate a first control signal and a second control signal according to the first signal and the second signal. A switch module is sued to connect to a first pin, a second pin, a third pin, and the control module. The switch module is used to receive the first control signal and the second control signal. The switch module is used to switch a connection among the first pin, the second pin, and the third pin according to the first control signal and the second control signal. The first pin and the second pin are suitable for connecting to the graphics card.

According to the switch device and the operation method thereof disclosed by the embodiment of the present invention, the control module generates the first control signal and the second control signal according to the first signal and the second signal, and the switch module switches the connection among the first pin, the second pin, and the third pin according to the first control signal and the second control signal, wherein the first pin and the second pin are suitable for connecting to the graphics card. Therefore, the different types of display cards may be operated normally on the same motherboard, thereby reducing the complexity of the design and increasing the convenience of use.

BRIEF DESCRIPTION OF THE DRAWINGS

The present invention can be more fully understood by reading the subsequent detailed description and examples with references made to the accompanying drawings, wherein:

FIG. 5 is a flowchart of an operation method of a switch device according to an embodiment of the present invention;

FIG. 7 is a flowchart of an operation method of a switch device according to an embodiment of the present invention.

DETAILED DESCRIPTION OF THE INVENTION

The following description is of the contemplated mode of carrying out the present invention. This description is made for the purpose of illustrating the general principles of the present invention and should not be taken in a limiting sense. The scope of the present invention is determined by reference to the appended claims.

The present invention will be described with respect to particular embodiments and with reference to certain drawings, but the present invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim component does not by itself connote any priority, precedence, or order of one claim component over another or the temporal order in which acts of a method are performed, but are used merely as labels to distinguish one claim component having a certain name from another component having the same name (but for use of the ordinal term) to distinguish the claim components.

In each of the following embodiments, the same reference number represents the same or similar element or component.

Figure 1:
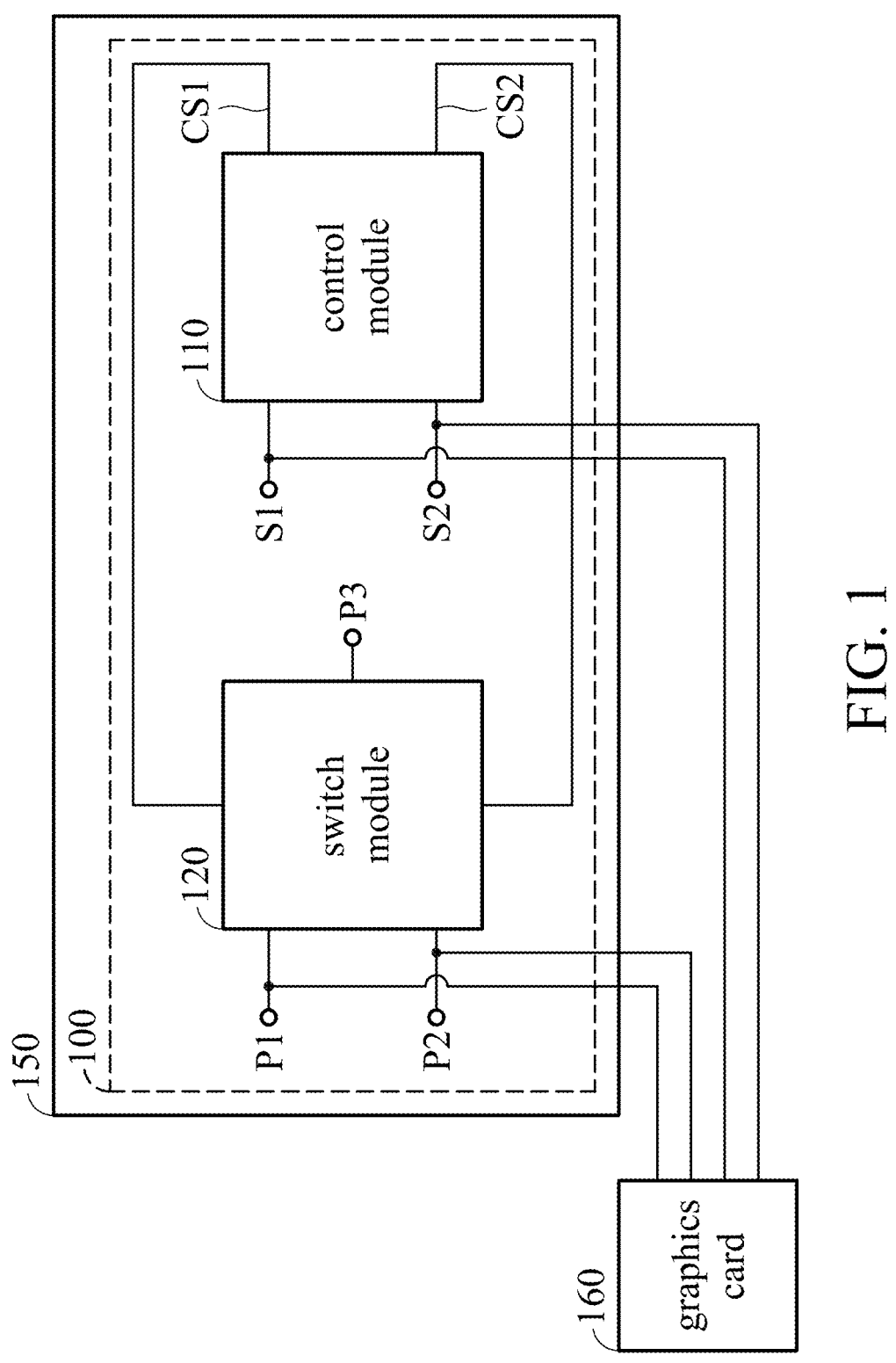
FIG. 1 is a schematic view of a switch device according to an embodiment of the present invention.

FIG. 1 is a schematic view of a switch device according to an embodiment of the present invention. In the embodiment, the switch device 100 may be disposed on a motherboard 150, and the motherboard 150 is suitable for connecting to a graphics card 160. Please refer to FIG. 1. The switch device 100 may include a control device 110 and a switch module 120.

The control module 110 may receive a first signal S1 and a second signal S2, and may generate a first control signal CS1 and a second control signal CS2 according to the first signal S1 and the second signal S2.

In some embodiments, the first pin P1 is, for example, the twelfth pin of a peripheral component interconnect express (PCIE) slot; the second pin P2 is, for example, the seventeenth pin of the PCIE slot; the third pin P3 is, for example, the clock signal control pin; the first signal S1 is generated by, for example, the first pin P1; and the second signal S2 is, for example a BUS reset signal or a signal of the eleventh pin of the A side of the gold finger of the PCIE slot. In addition, the second pin P2 may be connected to a graphics processing unit (GPU) of the graphics card. Furthermore, the third pin P3 may be connected to a central processing unit (CPU) or a platform controller hub (PCH) on the motherboard 150.

The switch module 120 may be connected to the first pin P1, the second pin P2, the third pin P3, and the control module 110. The switch module 120 may receive the first control signal CS1 and the second control signal CS2, and may switch a connection among the first pin P1, the second pin P2, and the third pin P3 according to the first control signal CS1 and the second control signal CS2. That is, the switch module 120 may connect the first pin Pl and the third pin P3, may connect the second pin P2 and the third pin P3, may disconnect a connection of the first pin P1 and the third pin P3, and may disconnect a connection of the second pin P2 and the third pin P3 according to the first control signal CS1 and the second control signal CS2. In addition, the above first pin P1 and the above second pin P2 are suitable for connecting to the graphics card 160.

In some embodiments, after the graphics card 160 is connected to the motherboard 150, when the type of the graphics card 160 is PCIE 3.0 and the motherboard 150 does not operate, in response to the type of the graphics card 160 being PCIE 3.0 and the motherboard 150 not being operated, the first signal S1 and the second signal S2 may be a low logic level, the first control signal CS1 and the second control signal CS2 may be a high logic level, and the switch module 120 may connect the second pin P2 and the third pin P3, and may connect the first pin P1 and the third pin P3. In addition, when the graphics card 160 is connected to the motherboard 150, in response to the graphics card 160 being connected to the motherboard 150, the logic level of the second pin P2 may be set to a low logic level. Furthermore, when the graphics card 160 and the motherboard 150 do not operate, in response to the graphics card 160 and the motherboard 150 not being operated, the logic level of the first pin P1 may be a low logic level.

In some embodiments, after the graphics card 160 is connected to the motherboard 150, when the type of the graphics card 160 is PCIE 3.0 and the motherboard 150 is operated, in response to the type of the graphics card 160 being PCIE 3.0 and the motherboard 150 being operated, the first signal S1 may be a low logic level, the second signal S2 may be a low logic level or a high logic level, the first control signal CS1 may be a low logic level, the second control signal CS2 may be a high logic level and the switch module 120 may connect the second pin P2 and the third pin P3, and may disconnect a connection of the first pin P1 and the third pin P3.

In addition, when the graphics card 160 is connected to the motherboard 150, in response the graphics card 160 being connected to the motherboard 150, the logic level of the second pin P2 may be set to a low logic level. Furthermore, when the motherboard 150 is operated, in response to the motherboard 150 being operated, the logic level of the first pin P1 may be pulled up to a high logic level. At this time, regardless of whether the second signal S2 is a logic level or a high logic level, the second control signal CS2 maintains a high logic level, so that the second pin P2 and the third pin P3 are connected. Then, the low logic level of the second pin P2 may be transmitted to the third pin P3, so that the central processing unit or the platform path controller on the motherboard 150 generate a clock signal to the graphics card 160, and then the graphics card 160 of PCIE 3.0 may normally operate.

In some embodiments, after the graphics card 160 is connected to the motherboard 150, when the type of the graphics card 160 is PCIE 4.0 and the motherboard 150 do not operate, in response to the type of the graphics card 160 being PCIE 4.0 and the motherboard 150 being not operated, the first signal S1 and the second signal S2 may be a low logic level, the first control signal CS1 and the second control signal CS2 may be a high logic level, and the switch module 120 may connect the second pin P2 and the third pin P3, and may connect the first pin P1 and the third pin P3. In addition, when the graphics card 160 is connected to the motherboard 150, in response to the graphics card 160 being connected to the motherboard 150, the logic level of the second pin P2 may be set to a low logic level. Furthermore, when the graphics card 160 and the motherboard 150 do not operate, in response to the graphics card 160 and the motherboard 150 not bring operated, the logic level of the first pin P1 may be a low logic level.

In some embodiments, after the graphics card 160 is connected to the motherboard 150, when the type of the graphics card 160 is PCIE 4.0, the motherboard 150 is operated and a clock request is not enabled, in response to the type of the graphics card 160 being PCIE 4.0, the motherboard 150 being operated and the clock request being not enabled, the first signal S1 may be a high logic level, the second signal S2 may be a low logic level, the first control signal CS1 may be a low logic level, the second control signal CS2 may be a high logic level, and the switch module 120 may connect the second pin P2 and the third pin P3, and may disconnect a connection of the first pin P1 and the third pin P3. That is, when the graphics card 160 does not operate, and the clock request is not enabled, the graphics card 160 may set the logic level of the first pin P1 to a high logic level.

In addition, when the graphics card 160 is connected to the motherboard 150, in response to the graphics card 160 being connected to the motherboard 150, the logic level of the second pin P2 may be set to a low logic level, and the low logic level of the second pin P2 may be transmitted to the third pin P3, so that the central processing unit or the platform path controller on the motherboard 150 generate a clock signal. At this time, since the graphics card 160 does not operate, the clock signal generated by the central processing unit or the platform path controller does not affect the functions of the motherboard 150 and the graphics card 160.

In some embodiments, after the graphics card 160 is connected to the motherboard 150, when the type of the graphics card 160 is PCIE 4.0, the motherboard 150 is operated and a clock request is enabled, in response to the type of the graphics card 160 being PCIE 4.0, the motherboard 150 being operated, and the clock request being enabled, the first signal S1 and the second signal S2 may be a low logic level, the first control signal CS1 and the second control signal CS2 may be a high logic level, and the switch module 120 may connect the second pin P2 and the third pin P3, and may connect the first pin P1 and the third pin P3. That is, when the graphics card 160 is operated and the clock request is enabled, the graphics card 160 may set the logic level of the first pin P1 to a low logic level.

At this time, the low logic level of the first pin P1 may be transmitted to the third pin P3, so that the central processing unit or the platform path controller on the motherboard 150 generates a clock signal to the graphics card 160, and then the graphics card 160 of PCIE 4.0 may normally operate. Although the second pin P2 and the third pin P3 are connected, and the first pin P1 and the third pin P3 are connected, the logic levels of the first pin P1 and the second pin P2 are a low logic level, so the functions of the motherboard 150 and the graphics card 160 are not affected.

In some embodiments, after the graphics card 160 is connected to the motherboard 150, when the type of the graphics card 160 is PCIE 4.0, the motherboard 150 is operated, and a clock signal of the motherboard 150 is stable, in response to the type of the graphics card 160 being PCIE 4.0, the motherboard 150 being operated, and the clock signal of the motherboard 150 being stable, the first signal S1 may be a low logic level, the second signal S2 may be a high logic level, the first control signal CS1 may be a high logic level, the second control signal CS2 may be a low logic level, and the switch module 120 may connect the first pin P1 and the third pin P3, and may disconnect a connection of the second pin P2 and the third pin P3. That is, when the clock signal of the motherboard 150 is stable, in response to the clock signal of the motherboard 150 being stable, the second signal S2 may be converted form a low logic level to a high logic level, and the second control signal CS2 may be converted from a high logic level to a low logic level, so that the switch module 120 disconnects the connection of the second pin P2 and the third pin P3, and the first pin P1 and the third pin P3 maintain to be connected. Therefore, two-way communication between the motherboard 150 and the graphics card 160 may be maintained.

In some embodiments, after the graphics card 160 is connected to the motherboard 150, when the type of the graphics card 160 is PCIE 4.0, the motherboard 150 is operated, and a clock request is disabled or enabled, in response to the type of the graphics card 160 being PCIE 4.0, the motherboard 150 being operated, and the clock request being disabled or enabled, the first signal S1 and the second signal S2 may be a high logic level, the first control signal CS1 may be a high logic level, the second control signal CS2 may be a low logic level, and the switch module 120 may connect the first pin P1 and the third pin P3, and may disconnect a connection of the second pin P2 and the third pin P3.

In the embodiment, when the motherboard 150 or the graphics card 160 needs to turn off the function of generating the clock signal, in response to the motherboard 150 or the graphics card 160 being needed to turn off the function of generating the clock signal, the motherboard 150 or the graphics card 160 may disable the clock request. That is, the motherboard 150 may set the logic level of the third pin P3 to a high logic level or the graphics card 160 may set the logic level of the first pin P1 to a high logic level, so that the central processing unit or the platform path controller on the motherboard 150 stops generating the clock signal. Therefore, the effect of power saving may be achieved.

In addition, after turning off the clock signal, when the motherboard 150 or the graphics card 160 needs to turn on the function of generating the clock signal, in response to the motherboard 150 or the graphics card 160 being needed to turn on the function of generating the clock signal, the motherboard 150 or the graphics card 160 may enable the clock request. That is, the motherboard 150 may set the logic level of the third pin P3 to a low logic level or the graphics card 160 may set the logic level of the first pin P1 to a low logic level, so that the central processing unit or the platform path controller on the motherboard 150 generates the clock signal.

In some embodiments, when the motherboard 150 is turned off or enters a sleep state (such a power state "S3"), in response to the motherboard 150 being turned off or entering the sleep state, the second signal S2 may be converted from a high logic level to a low logic level. At this time, the logic level of the first pin P1 (the first signal S1) is a low logic level, so that the first control signal CS1 and the second control signal CS2 are a high logic level, and the switch module 120 may connect the second pin P2 and the third pin P3, and may connect the first pin P1 and the third pin P3. Since the logic levels of the first pin Pl and the second pin P2 are a low logic level, the logic level of the third pin P3 is also fixed to a low logic level.

On the other hand, when the motherboard 150 is turned off or enters the sleep state (such as the power state "S3"), in response to the motherboard 150 being turned off or entering the sleep state, the graphics card 160 may convert the logic level of the first pin P1 from a low logic level to a high logic level. Then, the logic level of the first pin P1 may change from a high logic level to a low logic level since the motherboard 150 is turned off (power drop in the power state "S0"). At this time, the second signal S2 may be converted from a high logic level to a low logic level, so that the switch module 120 connects the second pin P2 and the third pin P3, and the logic level of the third pin P3 may be fixed to a low logic level. In addition, the switch module 120 may convert the connection of the first pin P1 and the third pin P3 to the disconnection of the first pin P1 and the third pin P3, and then convert to the connection of the first pin P1 and the third pin P3. Since the second pin P2 and the third pin P3 are connected, the logic level of the third pin P3 may maintain a low logic level, which is the same as the state when the motherboard 150 is just about to be turned on, and does not affect the functions of the motherboard 150 and the graphics card 160. That is, when the power is turned off, in response to the power being turned off, the logic level of the first pin P1 (the first signal S1) and the second signal S2 may change, but they may be a low logic level finally.

In some embodiments, when the motherboard 150 does not normally operate, i.e., the motherboard 150 hung on, the second signal S2 may maintain a low logic level and may not change. Since the motherboard 150 does not normally operate, the second control signal CS2 generated by the control module 110 may continue to be a high logic level, so that the switch module 120 connects the second pin P2 and the third pin P3. Then, the low logic level of the second pin P2 may be transmitted to the third pin P3, so that the central processing unit or the platform path controller on the motherboard 150 continues generating the clock signal.

In some embodiments, during the boot process of the motherboard 150, the graphics card 160 needs to double reset the PCIE bus. At this time, the first signal S1 received by the control module 110 may maintain a low logic level, the second signal S2 received by the control module 110 may be converted from a high logic level to a low logic level and then to a high logic level, and the second control signal CS2 generated by the control module 110 may be converted from a low logic level to a high logic level and then to a low logic level, so that the switch module 120 switches the connection of the second pin P2 and the third pin P3 from the disconnection of the second pin P2 and the third P3 to the connection of the second pin P2 and the third pin P3, and then to the disconnection of the second pin P2 and the third pin P3. Although the switch module 120 may connect the second pin P2 and the third pin P3, because the switch module 120 has connected the first pin P1 and the third pin P3, and the logic levels of the first pin P1 and the third pin P3 maintain a low logic level, which does not affect the functions of the motherboard 150 and the graphics card 160.

Therefore, through the operation of the switch device 100 according to the embodiment of the present invention, the display cards 160 with different types (PCIE 3.0 or PCIE 4.0) may normally operate, thereby saving the complexity of design and increasing the convenience of use.

Figure 2:
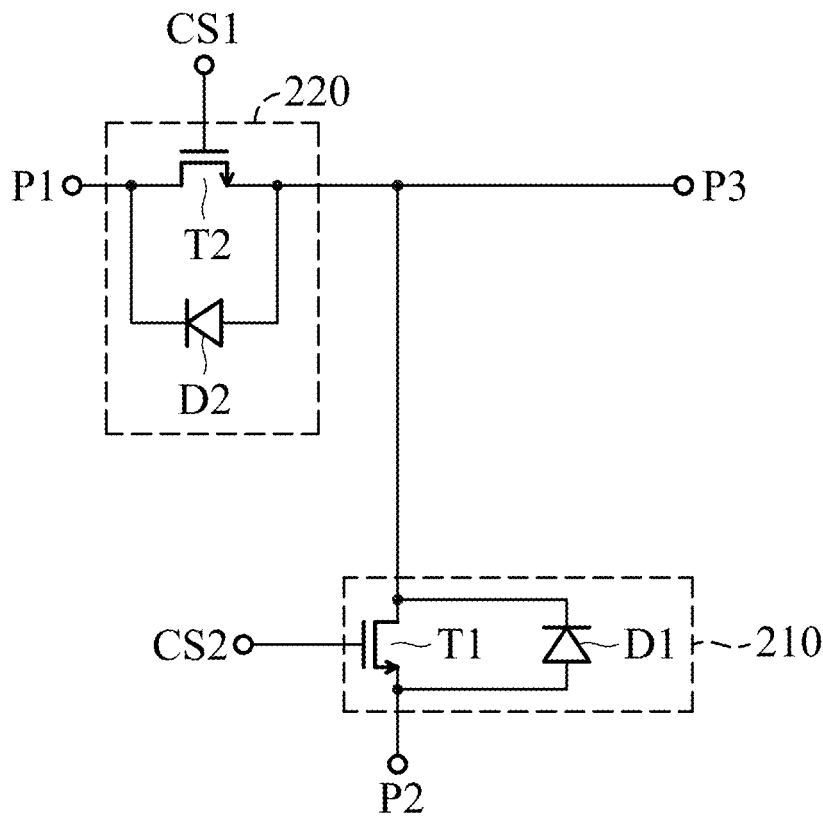
FIG. 2 is a schematic view of a switch module according to an embodiment of the present invention.

FIG. 2 is a schematic view of a switch module according to an embodiment of the present invention. Please refer to FIG. 2. The switch module 120 may include a first switch unit 210 and a second switch unit 220.

The first switch unit 210 may have a first terminal, a second terminal, and a control terminal. The first terminal of the first switch unit 210 is connected to the third pin P3. The second terminal of the first switch unit 210 is connected to the second pin P2. The control terminal of the first switch unit 210 receives the second control signal CS2.

Furthermore, the first switch unit 210 includes a first transistor T1 and a first diode D1. The first transistor T1 has a first terminal, a second terminal, and a control terminal. The first terminal of the first transistor T1 is connected to the first terminal of the first switch unit 210. The second terminal of the first transistor T1 is connected to the second terminal of the first switch unit 210. The control terminal of the first transistor T1 is connected to the control terminal of the first switch unit 210. The first diode D1 has a first terminal (such as a cathode terminal) and a second terminal (such as an anode terminal). The first terminal of the first diode D1 is connected to the first terminal of the first transistor T1. The second terminal of the first diode D1 is connected to the second terminal of the first transistor T1.

The second switch unit 220 has a first terminal, a second terminal, and a control terminal. The first terminal of the second switch unit 220 is connected to the first pin P1. The second terminal of the second switch unit 220 is connected to the third pin P3. The control terminal of the second switch unit 220 receives the second control signal CS2.

Furthermore, the second switch unit 220 includes a second transistor T2 and a second diode D2. The second transistor T2 has a first terminal, a second terminal, and a control terminal. The first terminal of the second transistor T2 is connected to the first terminal of the second switch unit 220. The second terminal of the second transistor T2 is connected to the second terminal of the second switch unit 220. The control terminal of the second transistor T2 is connected to the control terminal of the second switch unit 220. The second diode D2 has a first terminal (such as a cathode terminal) and a second terminal (such as an anode terminal). The first terminal of the second diode D2 is connected to the first terminal of the second transistor T2. The second terminal of the second diode D2 is connected to the second terminal of the second transistor T2.

In the embodiment, the first transistor T1 and the second transistor T2 are, for example, an N-type transistor, wherein the first terminals of the first transistor T1 and the second transistor T2 are, for example, a drain terminal of the N-type transistor, the second terminals of the first transistor T1 and the second transistor T2 are, for example, a source terminal of the N-type transistor, and the control terminals of the first transistor T1 and the second transistor T2 are, for example, a gate terminal of the N-type transistor, but the embodiment of the present invention is not limited thereto. In some embodiments, the first transistor T1 and the second transistor T2 may be a P-type transistor or another suitable transistor.

Figure 3:
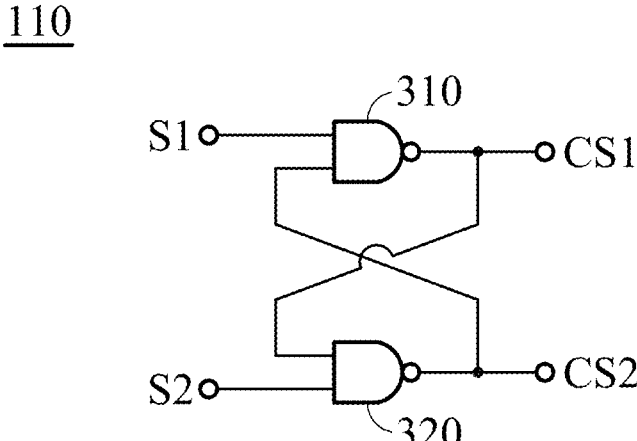
FIG. 3 is a schematic view of a control module according to an embodiment of the present invention.

FIG. 3 is a schematic view of a control module according to an embodiment of the present invention. Please refer to FIG. 3. The control module 110 may include a first NAND gate 310 and a second NAND gate 320. The first NAND gate 310 has a first input terminal, a second input terminal, and an output terminal. The first input terminal of the first NAND gate 310 receives the first signal S1. The output terminal of the first NAND gate 310 generates the first control signal CS1.

The second NAND gate 320 has a first input terminal, a second input terminal, and an output terminal. The first input terminal of the second NAND gate 320 receives the second signal S2. The second input terminal of the second NAND gate 320 is connected to the output terminal of the first NAND gate 310. The output terminal of the second NAND gate 320 is connected to the second input terminal of the first NAND gate 310 and generates the second control signal CS2.

Figure 4:
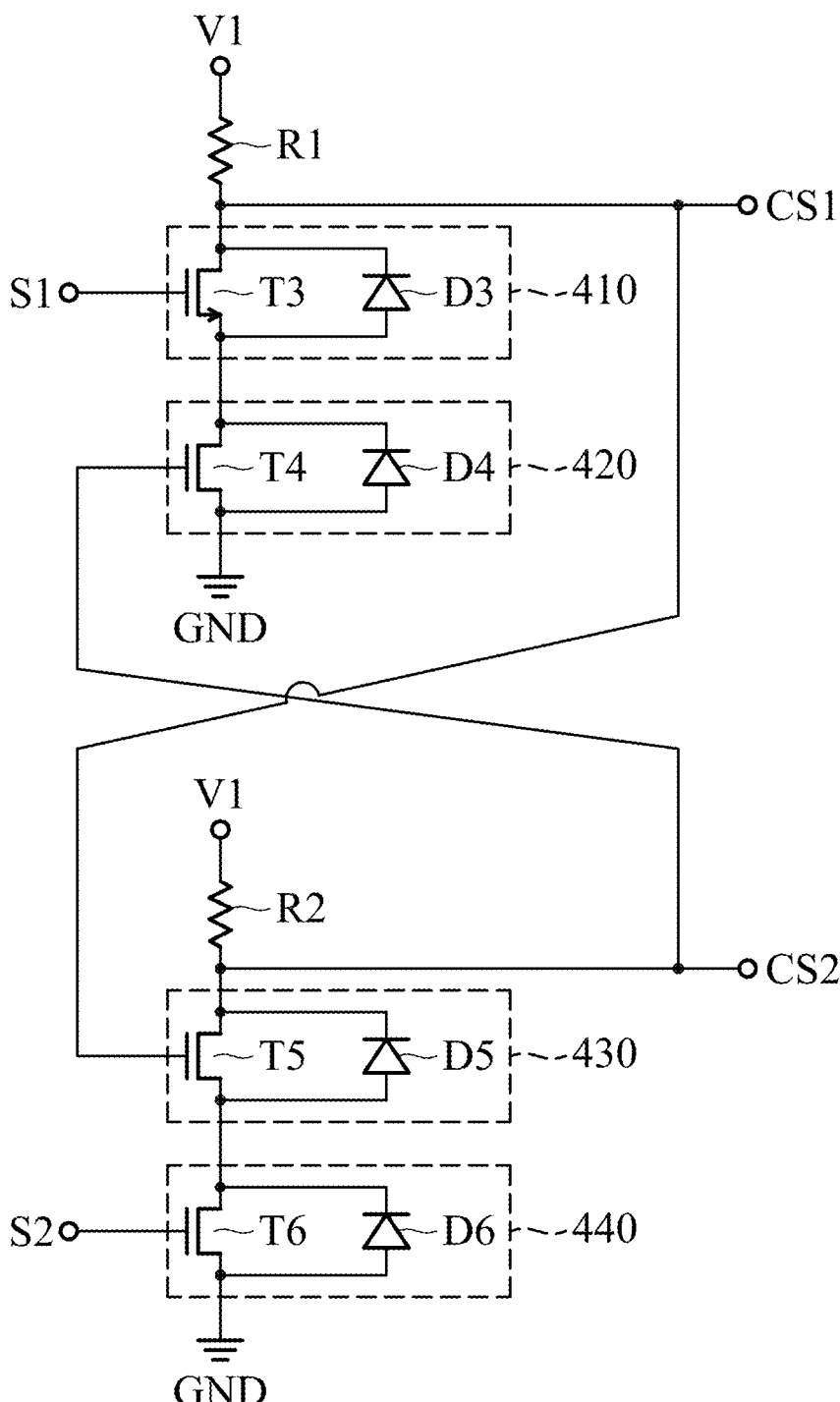
FIG. 4 is a schematic view of a control module according to an embodiment of the present invention.

FIG. 4 is a schematic view of a control module according to an embodiment of the present invention. Please refer to FIG. 4. The control module 110 may include a first resistor R1, a third switch unit 410, a fourth switch unit 420, a second resistor R2, a fifth switch unit 430 and a sixth switch unit 440. The first resistor R1 has a first terminal and a second terminal. The first terminal of the first resistor R1 is connected to a voltage V1 (such as a system voltage). The second terminal of the first resistor R1 generate the first control signal CS1.

The third switch unit 410 may have a first terminal, a second terminal, and a control terminal. The first terminal of the third switch unit 410 is connected to the second terminal of the resistor R1. The control terminal of the third switch unit 410 receives the first signal S1. Furthermore, the third switch unit 410 includes a third transistor T3 and a third diode D3. The third transistor T3 has a first terminal, a second terminal, and a control terminal. The first terminal of the third transistor T3 is connected to the first terminal of the third switch unit 410. The second terminal of the third transistor T3 is connected to the second terminal of the third switch unit 410. The control terminal of the third transistor T3 is connected to the control terminal of the third switch unit 410. The third diode D3 has a first terminal (such as a cathode terminal) and a second terminal (such as an anode terminal). The first terminal of the third diode D3 is connected to the first terminal of the third transistor T3. The second terminal of the third diode D3 is connected to the second terminal of the third transistor T3.

The fourth switch unit 420 may have a first terminal, a second terminal, and a control terminal. The first terminal of the fourth switch unit 420 is connected to the second terminal of the third switch unit 410. The second terminal of the fourth switch unit 420 is connected to a ground terminal GND. Furthermore, the fourth switch unit 420 includes a fourth transistor T4 and a fourth diode D4. The fourth transistor T4 has a first terminal, a second terminal, and a control terminal. The first terminal of the fourth transistor T4 is connected to first terminal of the fourth switch unit 420. The second terminal of the fourth transistor T4 is connected to the second terminal of the fourth switch unit 420. The control terminal of the fourth transistor T4 is connected to the control terminal of the fourth switch unit 420. The fourth diode D4 has a first terminal (such as a cathode terminal) and a second terminal (such as an anode terminal). The first terminal of the fourth diode D4 is connected to the first terminal of the fourth transistor T4. The second terminal of the fourth diode D4 is connected to the second terminal of the fourth transistor T4.

The second resistor R2 has a first terminal and a second terminal. The first terminal of the resistor R2 is connected to the voltage V1 (such as the system voltage). The second terminal of the second resistor R1 is connected to the control terminal of the fourth switch unit 420 and generates the second control signal CS2.

The fifth switch unit 430 may have a first terminal, a second terminal, and a control terminal. The first terminal of the fifth switch unit 430 is connected to the second terminal of the second resistor R2. The control terminal of the fifth switch unit 430 is connected to the second transistor of the first resistor R1. Furthermore, the fifth switch unit 430 includes a fifth transistor T5 and a fifth diode D5. The fifth transistor T5 has a first terminal, a second terminal, and a control terminal. The first terminal of the fifth transistor T5 is connected to the first terminal of the fifth switch unit 430. The second terminal of the fifth transistor T5 is connected to the second terminal of the fifth switch unit 430. The control terminal of the fifth transistor T5 is connected to the control terminal of the fifth switch unit 430. The fifth diode D5 has a first terminal (such as a cathode terminal) and a second terminal (such as an anode terminal). The first terminal of the fifth diode D5 is connected to the first terminal of the fifth transistor T5. The second terminal of the fifth diode D5 is connected to the second terminal of the fifth transistor T5.

The sixth switch unit 440 may have a first terminal, a second terminal, and a control terminal. The first terminal of the sixth switch unit 440 is connected to the second terminal of the fifth switch unit 430. The second terminal of the sixth switch unit 440 is connected to the ground terminal GND. The control terminal of the sixth switch unit 440 receives the second signal S2. Furthermore, the sixth switch unit 440 includes a sixth transistor T6 and a sixth diode D6. The sixth transistor T6 has a first terminal, a second terminal, and a control terminal. The first terminal of the sixth transistor T6 is connected to the first terminal of the sixth switch unit 440. The second terminal of the sixth transistor T6 is connected to the second terminal of the sixth switch unit 440. The control terminal of the sixth transistor T6 is connected to the control terminal of the sixth switch unit 440. The sixth diode D6 has a first terminal (such as a cathode terminal) and the second terminal (such as an anode terminal). The first terminal of the sixth diode D6 is connected to the first terminal of the sixth transistor T6. The second terminal of the sixth diode D6 is connected to the second terminal of the sixth transistor T6.

In the embodiment, the third transistor T3, the fourth transistor T4, the fifth transistor T5, and the sixth transistor T6 are, for example, an N-type transistor, wherein the first terminals of the third transistor T3, the fourth transistor T4, the fifth transistor T5, and the sixth transistor T6 are, for example, a drain terminal of the N-type transistor, the second terminals of the third transistor T3, the fourth transistor T4, the fifth transistor T5, and the sixth transistor T6 are, for example, a source terminal of the N-type transistor, and the control terminals of the third transistor T3, the fourth transistor T4, the fifth transistor T5, and the sixth transistor T6 are, for example, a gate terminal of the N-type transistor, but the embodiment of the present invention is not limited thereto. In some embodiments, the third transistor T3, the fourth transistor T4, the fifth transistor T5, and the sixth transistor T6 may be a P-type transistor or another suitable transistor.

FIG. 5 is a flowchart of an operation method of a switch device according to an embodiment of the present invention. In step S502, the method involves using a control module to receive a first signal and a second signal and generate a first control signal and a second control signal according to the first signal and the second signal. In step S504, the method involves using a switch module to connect to a first pin, a second pin, a third pin, and the control module, wherein the first pin and the second pin are suitable for connecting to the graphics card.

In step S506, the method involves using the switch module to receive the first control signal and the second control signal. In step S508, the method involves using the switch module to switch a connection among the first pin, the second pin, and the third pin according to the first control signal and the second control signal. In some embodiments, the first pin is, for example, the twelfth pin of a PCIE slot; the second pin is, the seventeenth pin of the PCIE slot, the third pin is, for example, a clock signal control pin, the first signal is generated by, for example, the first pin, and the second signal is, for example, a bus reset signal.

Figure 6:
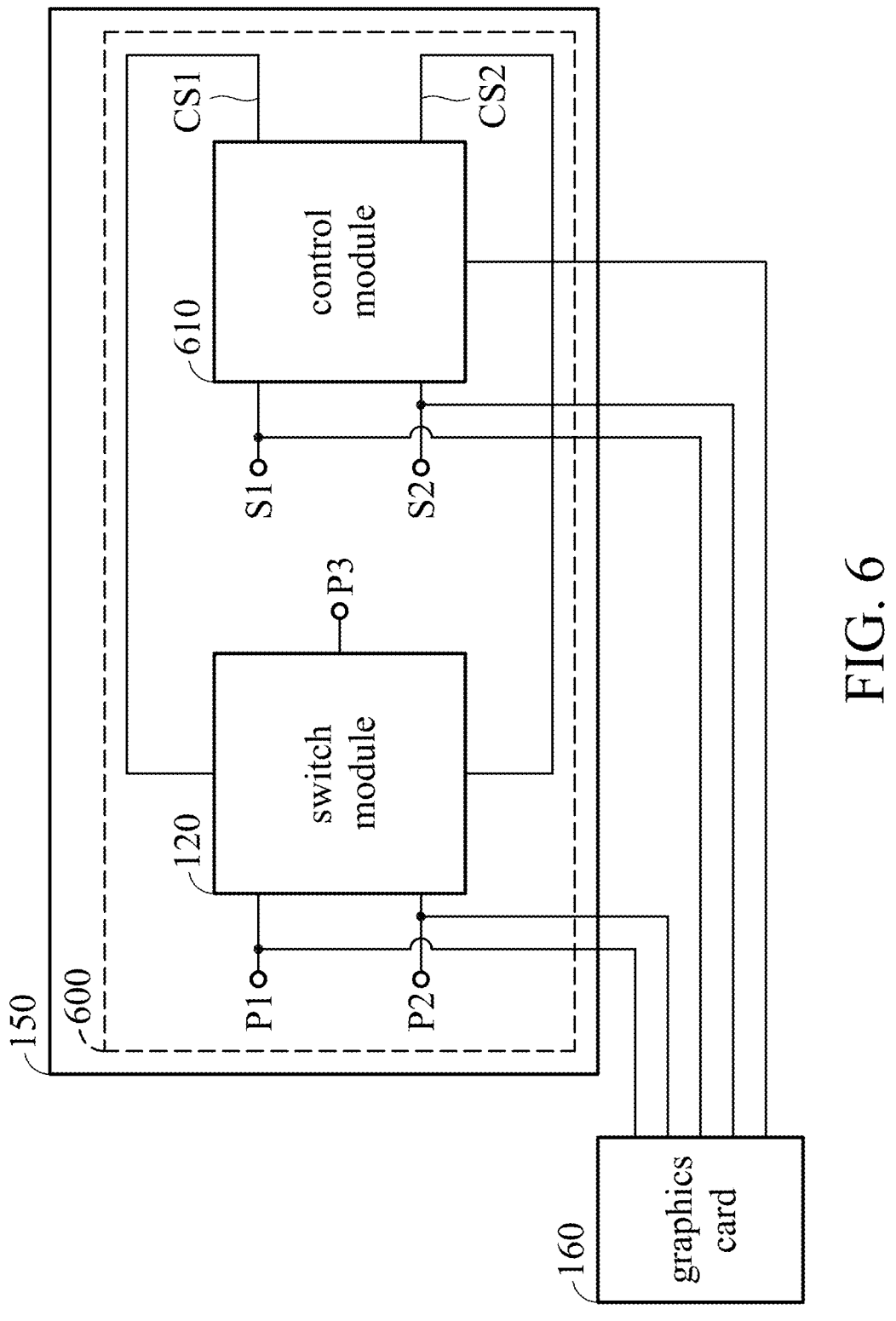
FIG. 6 is a schematic view of a switch device according to an embodiment of the present invention.

FIG. 6 is a schematic view of a switch device according to an embodiment of the present invention. In the embodiment, the switch device 600 may be disposed on a motherboard 150, and the motherboard 150 is suitable for connecting to a graphics card 160. Please refer to FIG. 6. The switch device 600 may include a control module 610 and a switch module 120. In the embodiment, the switch module 120 in FIG. 6 is the same as or similar to the switch module 120 in FIG. 1 and FIG. 2. Accordingly, the switch module 120 in FIG. 6 may refer to the description of the embodiment of FIG. 1 and FIG. 2, and the description is not repeated herein.

In addition, the first pin P1, the second pin P2, the third pin P3, the first signal S1 and the second signal S2 in FIG. 6 are the same as or similar to the first pin P1, the second pin P2, the third pin P3, the first signal S1 and the second signal S2 in FIG. 1. Accordingly, the first pin P1, the second pin P2, the third pin P3, the first signal S1 and the second signal S2 in FIG. 6 may refer to the description of the embodiment of FIG. 1, and the description is not repeated herein. Furthermore, the control module 610 may be a micro control unit (MCU) or a microprocessor, but the embodiment of the present invention is not limited thereto.

Firstly, the motherboard 150 is powered on and enters a basic input output system power on self-test (BIOS POST). Then, the control module 610 may determine whether the graphics card data does not exist or whether there is an event that the casing is opened. In the embodiment, the graphics card data is stored in a storage module (not shown), wherein the storage module may be a non-volatile random access memory (NVRAM) of the basic input output system, but the embodiment of the present invention is not limited thereto.

When the control module 610 determines that the graphics card data does not exist or there is an event that the casing is opened, in response to the graphics card data not being existed or there being an event that the casing is opened, the control module 610 may read the device identifier (device ID) of the graphics card 160 or the first signal S1 (such as the signal of an eleventh pin of the B side of the gold finger of the PCIE slot), so as to determine the type of the graphics card 160.

That is, in some embodiments, the control module 610 may read the device identifier of the graphics card 160, and may determine the type of the graphics card 160 is PCIE 4.0 (or a device after PCIe4.0) or PCIe3.0 (or a device before PCIe3.0) according to the device identifier. In some embodiments, the control module 610 may read the first signal S1, and may determine the type of the graphics card 160 according to the logic of the first signal S1. For example, when the logic of the first signal S1 is a low logic level, in response to the logic of the first signal S1 being a low logic level, the control module 610 may determine that the type of the graphics card 160 is PCIe4.0 or the device after PCIe4.0. When the logic of the first signal S1 is a high logic level, in response to the logic of the first signal S1 being a high logic level, the control module 610 may determine that the type of the graphics card 160 is PCIe3.0 or the device before PCIe3.0.

Then, the control module 610 may store the type of the graphics card 160, and may set the first control signal CS1 and the second control signal CS2 according to the type of the graphics card 160. For example, when the control module 610 determines that the type of the graphics card 160 is PCIe4.0 or the device after PCIe4.0, in response to the type of the graphics card 160 being PCIe4.0 or the device after PCIe4.0, the control module 610 may set the first control signal CS1 to a high logic level and set the second control signal CS2 to a low logic level, so that the switch module 120 connects the first pin P1 and the third pin P3, and disconnects a connection of the second pin P2 and the third pin P3.

When the control module 610 determines that the type of the graphics card 160 is PCIe3.0 or the device before PCIe3.0, in response to the type of the graphics card 160 being PCIe3.0 or the device before PCIe3.0, the control module 610 may set the first control signal CS1 to a low logic level and set the second control signal CS2 to a high logic level, so that the switch module 120 connects the second pin P2 and the third pin P3, and disconnects a connection of the first pin P1 and the third pin P3.

In addition, when the control module 610 determines that the graphics card data is existed or there is no event that the casing is opened, in response to the graphics card data being existed or there being no event that the casing is opened, the control module 610 may read the graphics card data. Then, the control module 610 may determine the type of the graphics card 160 according to the graphics card data, and may set the first control signal CS1 and the second control signal CS2 according to the type of the graphics card 160.

FIG. 7 is a flowchart of an operation method of a switch device according to an embodiment of the present invention. In step S702, the method involves the motherboard being powered on and entering a basic input output system power on self-test. In step S704, the method involves using the control module to determine whether the graphics card data does not exist or whether there is an event that the casing is opened. When determining that the graphics card data does not exist or there is an event that the casing is opened, the method performs step S706. In step S706, the method involves in response to the graphics card data not being existed or there being an event that the casing is opened, reading the device identifier of the graphics card or the first signal, so as to determine the type of the graphics card. In step S708, the method involves using the control module to store the type of the graphics card, and setting the first control signal and the second control signal according to the type of the graphics card.

When determining that the graphics card data is existed or there is no event that the casing is opened, the method performs step S710. In step S710, the method involves in response to the graphics card data being existed or there being no event that the casing is opened, determining the type of the graphics card according to the graphics card data, and setting the first control signal and the second control signal according to the type of the graphics card.

In step S712, the method involves using the switch module to connect to the first pin, the second pin, the third pin, and the control module, wherein the first pin and the second pin are suitable for connecting to the graphics card. In step S714, the method involves using the switch module to receive the first control signal and the second control signal. In step S716, the method involves using the switch module to switch the connection among the first pin, the second pin, and the third pin according to the first control signal and the second control signal. In step S718, the method involves completing the basic input output system power on self-test and the motherboard being powered on successfully.

It should be noted that the order of the steps of FIG. 5 and FIG. 7 is only for illustrative purposes, and is not intended to limit the order of the steps of the present invention. The user may change the order of the steps above to meet specific requirements. The flowcharts described above may add additional steps or use fewer steps without departing from the spirit and scope of the present invention.

In summary, according to the switch device and the operation method thereof disclosed by the embodiment of the present invention, the control module generates the first control signal and the second control signal according to the first signal and the second signal, and the switch module switches the connection among the first pin, the second pin, and the third pin according to the first control signal and the second control signal, wherein the first pin and the second pin are suitable for connecting to the graphics card. Therefore, the different types of display cards may be operated normally on the same motherboard, thereby reducing the complexity of the design and increasing the convenience of use.

While the present invention has been described by way of example and in terms of the preferred embodiments, it should be understood that the present invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A switch device, disposed on a motherboard, wherein the motherboard is suitable for connecting to a graphics card, and the switch device comprises:

a control module, configured to receive a first signal and a second signal and generate a first control signal and a second control signal according to the first signal and the second signal; and a switch module, connected to a first pin, a second pin, a third pin, and the control module, wherein the switch module is configured to receive the first control signal and the second control signal, and to connect the first pin and the third pin, to connect the second pin and the third pin, to disconnect a connection of the first pin and the third pin, and to disconnect a connection of the second pin and the third pin according to the first control signal and the second control signal; and wherein the first pin and the second pin are suitable for connecting to the graphics card.

2. The switch device as claimed in claim 1, wherein the first pin is a twelfth pin of a peripheral component interconnect express (PCIE) slot, the second pin is a seventeenth pin of the PCIE slot, the third pin is a clock signal control pin, the first signal is generated by the first pin, and the second signal is a bus reset signal.

3. The switch device as claimed in claim 1, wherein the switch module comprises:

a first switch unit, having a first terminal, a second terminal and a control terminal, wherein the first terminal of the first switch unit is connected to the third pin, the second terminal of the first switch unit is connected to the second pin, and the control terminal of the first switch unit is configured to receive the second control signal; and a second switch unit, having a first terminal, a second terminal and a control terminal, wherein the first terminal of the second switch unit is connected to the first pin, the second terminal of the second switch unit is connected to the third pin, and the control terminal of the second switch unit is configured to receive the first control signal.

4. The switch device as claimed in claim 1, wherein the control module comprises:

a first NAND gate, having a first input terminal, a second input terminal, and an output terminal, wherein the first input terminal of the first NAND gate is configured to receive the first signal, and the output terminal of the first NAND gate is configured to generate the first control signal; and a second NAND gate, having a first input terminal, a second input terminal, and an output terminal, wherein the first input terminal of the second NAND gate is configured to receive the second signal, the second input terminal of the second NAND gate is connected to the output terminal of the first NAND gate, and the output terminal of the second NAND gate is connected to the second input terminal of the first NAND gate and configured to generate the second control signal.

5. The switch device as claimed in claim 1, wherein in response to a type of the graphics card being PCIE 3.0 and the motherboard not being operated, the first signal and the second signal are a low logic level, the first control signal and the second control signal are a high logic level, and wherein the switch module connects the second pin and the third pin, and connects the first pin and the third pin.

6. The switch device as claimed in claim 1, wherein in response to a type of the graphics card being PCIE 3.0 and the motherboard being operated, the first signal is a low logic level, the second signal is a low logic level or a high logic level, the first control signal is a low logic level, the second control signal is a high logic level, and wherein the switch module connects the second pin and the third pin, and disconnects a connection of the first pin and the third pin.

7. The switch device as claimed in claim 1, wherein in response to a type of the graphics card being PCIE 4.0 and the motherboard not being operated, the first signal and the second signal are a low logic level, the first control signal and the second control signal are a high logic level, and wherein the switch module connects the second pin and the third pin, and connects the first pin and the third pin.

8. The switch device as claimed in claim 1, wherein in response to a type of the graphics card being PCIE 4.0, the motherboard being operated, and a clock request not being enabled, the first signal is a high logic level, the second signal is a low logic level, the first control signal is a low logic level, the second control signal is a high logic level, and wherein the switch module connects the second pin and the third pin, and disconnects a connection of the first pin and the third pin.

9. The switch device as claimed in claim 1, wherein in response to a type of the graphics card being PCIE 4.0, the motherboard being operated, and a clock request being enabled, the first signal and the second signal are a low logic level, the first control signal and the second control signal are a high logic level, and wherein the switch module connects the second pin and the third pin, and connects the first pin and the third pin.

10. The switch device as claimed in claim 1, wherein in response to a type of the graphics card being PCIE 4.0, the motherboard being operated, and a clock signal of the motherboard being stable, the first signal is a low logic level, the second signal is a high logic level, the first control signal is a high logic level, the second control signal is a low logic level, and wherein the switch module connects the first pin and the third pin, and disconnects a connection of the second pin and the third pin.

11. The switch device as claimed in claim 1, wherein in response to a type of the graphics card being PCIE 4.0, the motherboard being operated, and a clock request being disabled or enabled, the first signal and the second signal are a high logic level, the first control signal is a high logic level, the second control signal is a low logic level, and wherein the switch module connects the first pin and the third pin, and disconnects a connection of the second pin and the third pin.

12. An operation method of a switch device, wherein the switch device is disposed on a motherboard, the motherboard is suitable to connect to a graphics card, and the operation method of the switch device comprises:

using a control module to receive a first signal and a second signal and to generate a first control signal and a second control signal according to the first signal and the second signal;

using a switch module to connect to a first pin, a second pin, a third pin, and the control module, wherein the first pin and the second pin are suitable to connect to the graphics card;

using the switch module to receive the first control signal and the second control signal; and using the switch module to connect the first pin and the third pin, to connect the second pin and the third pin, to disconnect a connection of the first pin and the third pin, and to disconnect a connection of the second pin and the third pin according to the first control signal and the second control signal.

13. The operation method of the switch device as claimed in claim 12, wherein the first pin is a twelfth pin of a peripheral component interconnect express (PCIE) slot, the second pin is a seventeenth pin of the PCIE slot, the third pin is a clock signal control pin, the first signal is generated by the first pin, and the second signal is a bus reset signal.

14. The operation method of the switch device as claimed in claim 12, wherein in response to a type of the graphics card being PCIE 3.0 and the motherboard not being operated, the first signal and the second signal are a low logic level, the first control signal and the second control signal are a high logic level, and wherein the switch module connects the second pin and the third pin, and connects the first pin and the third pin.

15. The operation method of the switch device as claimed in claim 12, wherein in response to a type of the graphics card being PCIE 3.0 and the motherboard being operated, the first signal is a low logic level, the second signal is a low logic level or a high logic level, the first control signal is a low logic level, the second control signal is a high logic level, and wherein the switch module connects the second pin and the third pin, and disconnects a connection of the first pin and the third pin.

16. The operation method of the switch device as claimed in claim 12, wherein in response to a type of the graphics card being PCIE 4.0 and the motherboard not being operated, the first signal and the second signal are a low logic level, the first control signal and the second control signal are a high logic level, and wherein the switch module connects the second pin and the third pin, and connects the first pin and the third pin.

17. The operation method of the switch device as claimed in claim 12, wherein in response to a type of the graphics card being PCIE 4.0, the motherboard being operated, and a clock request not being enabled, the first signal is a high logic level, the second signal is a low logic level, the first control signal is a low logic level, the second control signal is a high logic level, and wherein the switch module connects the second pin and the third pin, and disconnects a connection of the first pin and the third pin.

18. The operation method of the switch device as claimed in claim 12, wherein in response to a type of the graphics card being PCIE 4.0, the motherboard being operated, and a clock request being enabled, the first signal and the second signal are a low logic level, the first control signal and the second control signal are a high logic level, and wherein the switch module connects the second pin and the third pin, and connects the first pin and the third pin.

19. The operation method of the switch device as claimed in claim 12, wherein in response to a type of the graphics card being PCIE 4.0, the motherboard being operated, and a clock signal of the motherboard being stable, the first signal is a low logic level, the second signal is a high logic level, the first control signal is a high logic level, the second control signal is a low logic level, and wherein the switch module connects the first pin and the third pin, and disconnects a connection of the second pin and the third pin.

20. The operation method of the switch device as claimed in claim 12, wherein in response to a type of the graphics card being PCIE 4.0, the motherboard being operated, and a clock request being disabled or enabled, the first signal and the second signal are a high logic level, the first control signal is a high logic level, the second control signal is a low logic level, and wherein the switch module connects the first pin and the third pin, and disconnects a connection of the second pin and the third pin.

* * * * *